(12) United States Patent
Block et al.

(10) Patent No.: US 9,297,873 B2
(45) Date of Patent: Mar. 29, 2016

(54) METHOD TO SELECT AN UNDERSAMPLING SCHEME FOR MAGNETIC RESONANCE IMAGING, AND MAGNETIC RESONANCE IMAGING METHOD AND SYSTEM USING SUCH A SELECTED UNDERSAMPLING SCHEME

(71) Applicants: Kai Tobias Block, New York, NY (US); Stephan Kannengiesser, Wuppertal (DE); Marcel Dominik Nickel, Erlangen (DE)

(72) Inventors: Kai Tobias Block, New York, NY (US); Stephan Kannengiesser, Wuppertal (DE); Marcel Dominik Nickel, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 741 days.

(21) Appl. No.: 13/627,042

(22) Filed: Sep. 26, 2012

(65) Prior Publication Data

US 2013/0076352 A1  Mar. 28, 2013

(30) Foreign Application Priority Data

Sep. 26, 2011  (DE) .......................... 10 2011 083 406

(51) Int. Cl.
*G01R 33/561* (2006.01)
(52) U.S. Cl.
CPC .................................. *G01R 33/5611* (2013.01)
(58) Field of Classification Search
CPC .................................................. G01R 33/5611
See application file for complete search history.

(56) References Cited

U.S. PATENT DOCUMENTS

| | | | | |
|---|---|---|---|---|
| 7,394,252 B1* | 7/2008 | Lin | ..................... | G01R 33/5611 324/307 |
| 7,576,536 B2* | 8/2009 | Akao | ................. | G01R 33/5611 324/307 |
| 8,319,495 B1* | 11/2012 | Zhu | ..................... | G01R 33/5612 324/307 |
| 8,400,152 B2* | 3/2013 | Lin | ..................... | G01R 33/5611 324/309 |
| 8,502,535 B2* | 8/2013 | Jurrissen | .............. | G01R 33/022 324/307 |

(Continued)

OTHER PUBLICATIONS

Huang et al.; T2 mapping from highly undersampled data by reconstruction of principal component coefficient maps using compressed sensing; May 2012; Magnetic Resonance in Medicine; vol. 67; Issue 5; pp. 1355-1366.*

(Continued)

*Primary Examiner* — Dixomara Vargas
(74) *Attorney, Agent, or Firm* — Schiff Hardin LLP

(57) ABSTRACT

In a method to select an undersampling scheme of k-space and an associated set of reconstruction kernels to acquire reduced magnetic resonance (MR) data sets with multiple coils, a calibration data set is acquired for each of the respective coils, a noise covariance is determined from autocorrelations and correlations of the noise of the various coils. At least one set of reconstruction kernels is calculated for each of the multiple undersampling schemes from the calibration data sets of the various coils. For each set of reconstruction kernels, a characteristic value is calculated from the noise covariance and the respective reconstruction kernels of the coils, with the characteristic value being proportional to a spatial mean value of a signal noise of an MR image. A selected undersampling scheme and a selected set of reconstruction kernels are selected based on the calculated characteristic values.

9 Claims, 3 Drawing Sheets

(56) References Cited

U.S. PATENT DOCUMENTS

| | | | | |
|---|---|---|---|---|
| 8,538,115 | B2* | 9/2013 | Zhang | G01R 33/5611 382/131 |
| 8,581,589 | B2* | 11/2013 | Wald | G01R 33/3415 324/318 |
| 8,638,096 | B2* | 1/2014 | Zhang | G01R 33/5611 324/307 |
| 8,781,197 | B2* | 7/2014 | Wang | G01R 33/54 382/131 |
| 8,823,374 | B2* | 9/2014 | Weller | G01R 33/5611 324/307 |
| 8,831,318 | B2* | 9/2014 | Sharif | G01R 33/5611 382/131 |
| 8,901,927 | B2* | 12/2014 | Gross | G01R 33/5611 324/309 |
| 2011/0044524 | A1* | 2/2011 | Wang et al. | 382/131 |
| 2012/0133361 | A1* | 5/2012 | Gross | 324/309 |

OTHER PUBLICATIONS

Ramani et al.; Cross-validation and predicted risk estimation for nonlinear iterative reweighted least-squares MRI reconstruction; Image Processing (ICIP), 2012 19$^{th}$ IEEE Internation Conference; Oct. 20, 2012.*

Bauer et al.; The effect of reconstruction and acquisition parameters for GRAPPA-based parallel imaging on the image quality; Aug. 2011; Magnetic Resonance in Medicine; vol. 66; Issue 2; pp. 402-409.*

Chang et al.; Nonlinear Grappa: A kernel approach to parallel MRI reconstruction; Sep. 2012; Magnetic Resonance in Medicine; vol. 68; Issue 3; pp. 730-740.*

Weller et al.; Regularizing GRAPPA Using Simultaneous Sparsity to Recover De-noised Images; Wavelets and sparsity XIV;pp. 21-24; Aug. 2011.*

Block et al.; Model-Based Iterative Reconstruction for Radial Fast Spin-Echo MRI; IEEE Transactions on Medical Imaging; vol. 28; No. 11; Nov. 2009.*

Nana et al., Cross-Validation-Based Kernel Support Selection for Improved GRAPPA Reconstruction, Magnetic Resonance in Medicine, vol. 59 (2008), pp. 819-825.

Breuer et al., "General Formulation for Quantitative G-factor Calculation in GRAPPA Reconstructions," Magnetic Resonance in Medicine, vol. 62 (2009), pp. 739-756.

Breuer et al., "Controlled Aliasing in Volumetric Parallel Imaging (2D Caipirinha)," Magnetic Resonance in Medicine, vol. 55 (2006), pp. 549-556.

Lin et al.: "Parallel MRI Reconstruction Using Variance Partitioning Regularization", Magnetic Resonance in Medicine, vol. 58, pp. 735-744; (2007).

Kellmann "Image reconstruction in SNR units: A general method for SNR measurement" Magnetic Resonance in Medicine, vol. 54, pp. 1439-1447 (2005).

Petr et al: "Parallel Image Reconstruction Using B-Spline Approximation (PROBER)", Magnetic Resonance in Medicine, vol. 58, pp. 582-591; (2007).

Lustig et al, "An Eigen-Vector Approach to AutoCalibrating Parallel MRI, Where SENSE Meets GRAPPA," Proc. Intl. Soc. Mag. Reson. Med., vol. 19, p. 479; (2011).

* cited by examiner

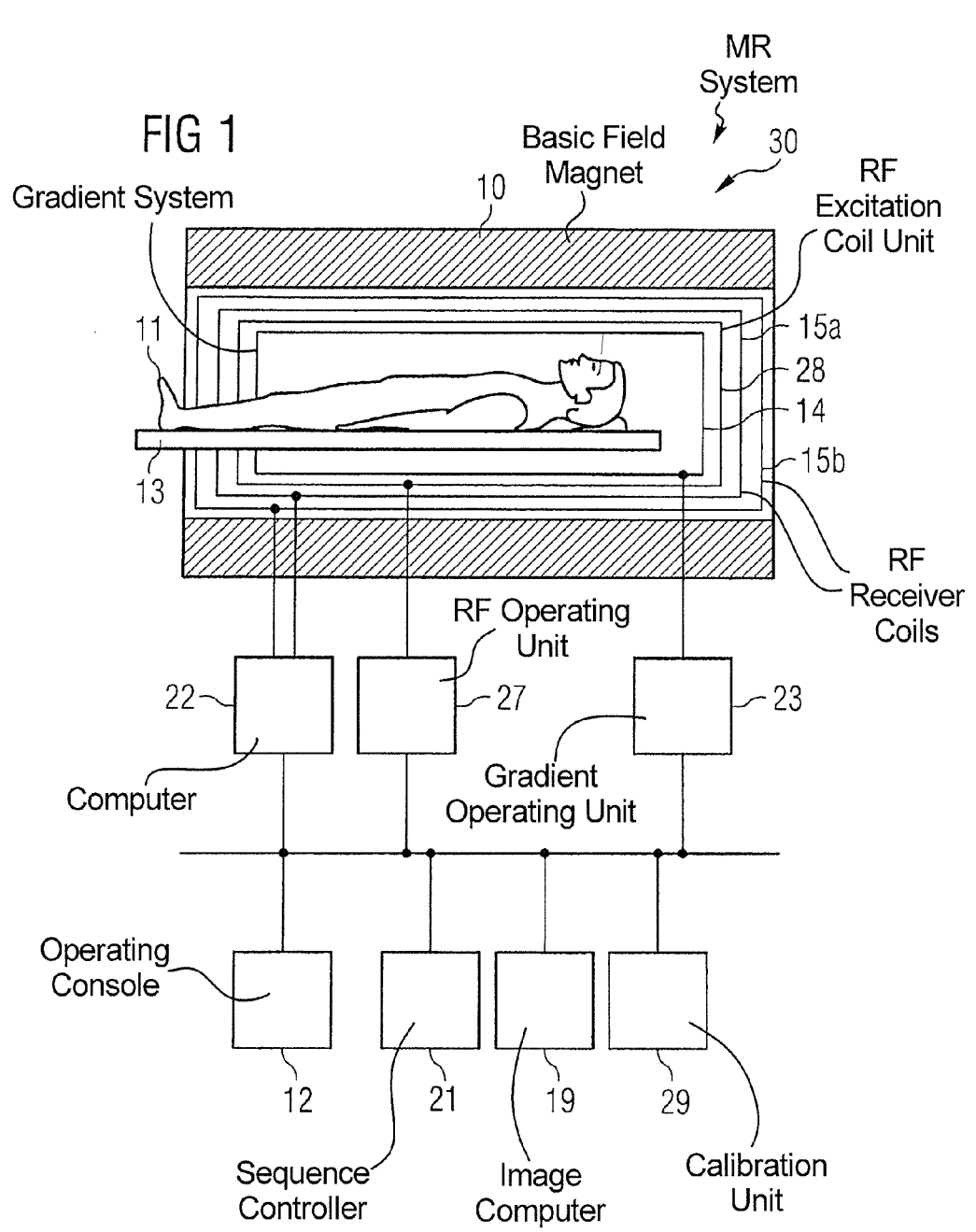

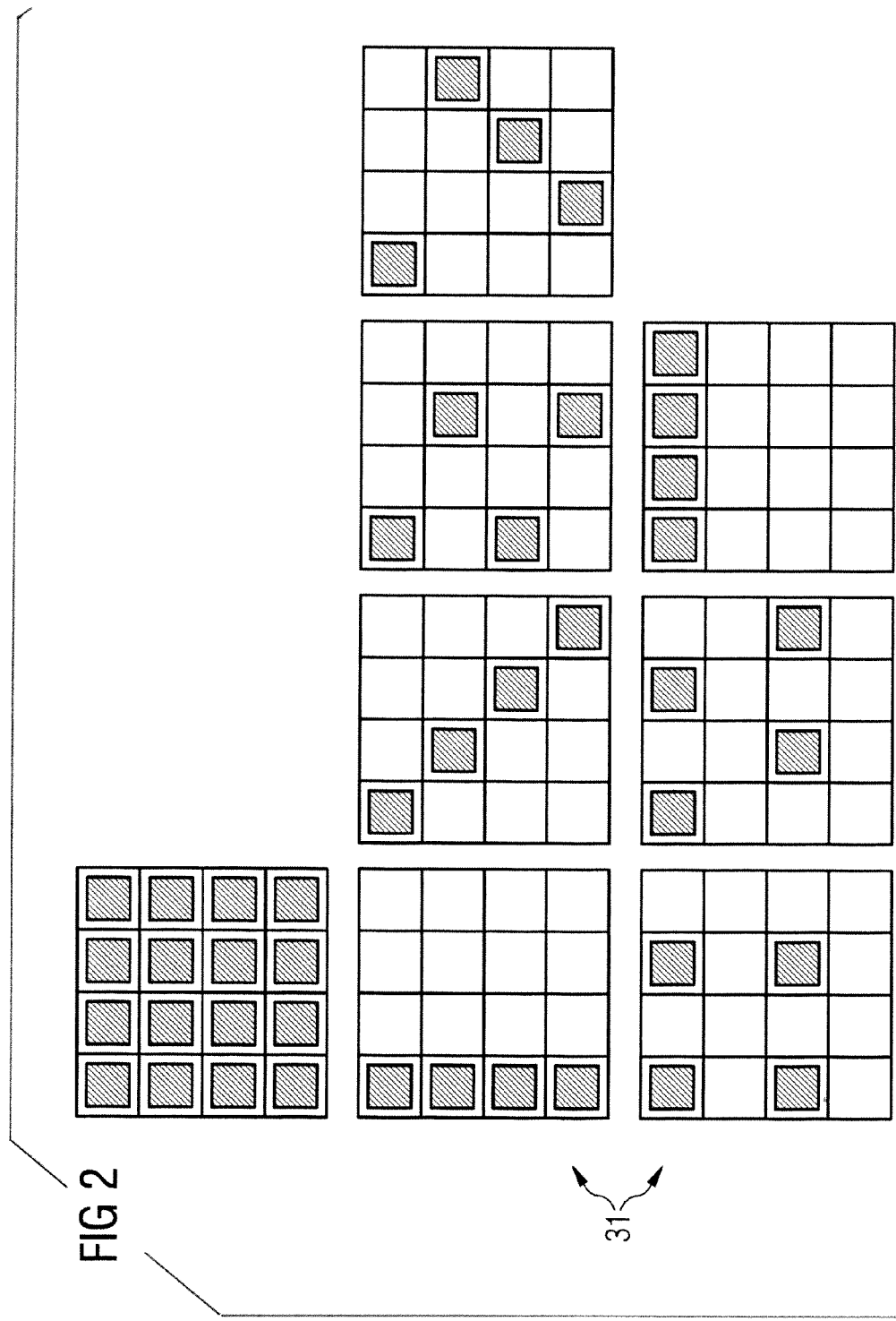

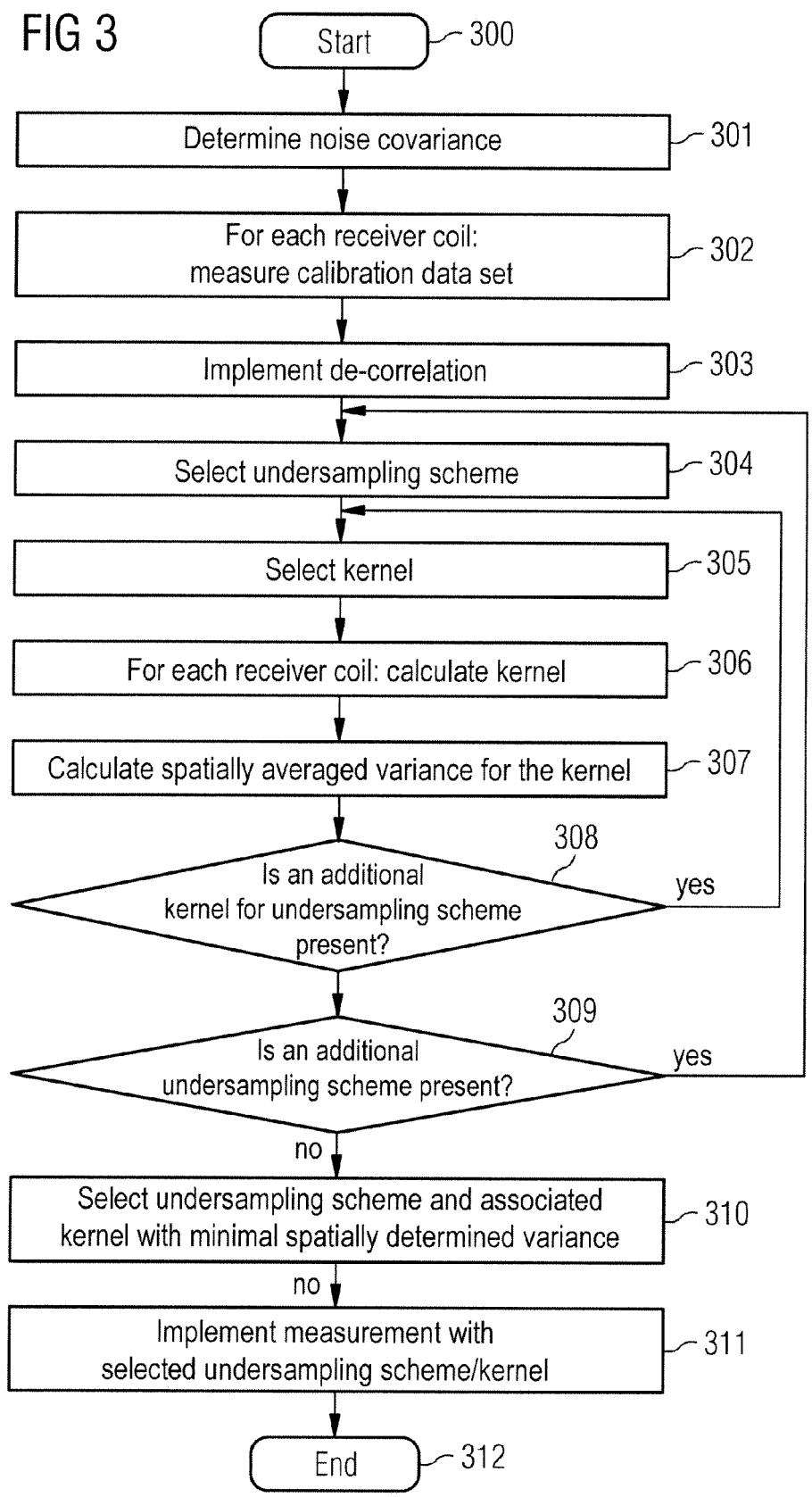

METHOD TO SELECT AN UNDERSAMPLING SCHEME FOR MAGNETIC RESONANCE IMAGING, AND MAGNETIC RESONANCE IMAGING METHOD AND SYSTEM USING SUCH A SELECTED UNDERSAMPLING SCHEME

BACKGROUND OF THE INVENTION

1. Field of the Invention

The present invention concerns a method to select an undersampling scheme for sampling k-space and an associated set of reconstruction kernels. Furthermore, the invention concerns a method for magnetic resonance imaging. The present invention furthermore concerns a magnetic resonance system for implementing such a method.

2. Description of the Prior Art

Magnetic resonance (MR) tomography (MRT) is an imaging method that enables the acquisition of two-dimensional or three-dimensional image data sets that can map structures inside an examined person (even soft tissues) with high resolution. In MRT, the magnetic moments of protons in an examination subject are aligned in a basic magnetic field. By radiating radio-frequency pulses, the nuclear spins can be deflected or excited out of the aligned state (i.e. the rest state) or another state. The temporal evolution of the excited magnetization is subsequently detected by one or more radio-frequency (RF) coils.

By applying a slice selection gradient in the radiation of radio-frequency pulses, only nuclear spins in a slice of the examination subject in which the resonance condition is satisfied due to the local magnetic field strength are excited. An additional spatial coding can take place by the application of at least one phase coding gradient as well as a frequency coding gradient during the readout. It is thereby possible to acquire MR exposures of multiple slices of an examined person. By means of suitable presentation methods it is possible to provide a 3-dimensional (3D) image of a defined region of the examined person for diagnosis.

The acquired MR signals are initially present in a spatial frequency domain (also known as k-space) and can be transformed into the image domain by subsequent Fourier transformation. K-space can be scanned (meaning raw (acquired) data are entered into k-space at respective locations therein) with various trajectories by an appropriately designed switching of the magnetic field gradients. A conventional scanning includes the successive acquisition of frequency-coded k-space lines (which are generally oriented along the x-axis of k-space) for respectively different phase codings (that define the y-axis and z-axis of k-space).

Ever faster MR acquisitions—in particular 3D MR acquisitions—are sought in clinical environments. MR measurement sequences to generate MR exposures can be optimized in this regard. For this purpose, 3-dimensional k-space is typically undersampled in two directions, and the missing information is filled in by the use of correlations between signals.

Various different undersamplings are possible, with each measurement being implemented simultaneously with multiple radio-frequency coils. The simultaneously acquired data can be spatially separated by means of suitable computation operations with the knowledge of the spatial acquisition characteristics of the various radio-frequency coils. It is thereby possible to obtain the spatial resolution from the information about the sensitivity of the coils, instead of implementing a relatively slower switching of slice selection gradients. An acceleration factor is defined using the RF coils that are present can be used for parallel imaging. For example, such methods are known under the names "Generalized Auto-Calibrating Partial Parallel Acquisition" (GRAPPA), "Sensitivity Encoding" (SENSE), "Simultaneous Acquisition of Spatial Harmonics" (SMASH) and "Controlled Aliasing in Parallel Imaging Results in Higher Acceleration" (CAIPIRINHA).

In some of these methods, an additional acceleration of the MR imaging can take place by not all points of k-space being scanned. This means that the measurement resolution is decreased in a targeted manner during the data acquisition, in comparison to a maximum achievable measurement resolution. An undersampling of k-space thus occurs. A reduced MR data set thus can be achieved. A reduction factor can characterize the undersampling. If the reduction factor is four, for example, the measurement point density in k-space is reduced by a factor of four. There are various possibilities to implement the undersampling of k-space at a given reduction factor. The manner in which the undersampling takes place is designated as an undersampling scheme. For example, an undersampling scheme can establish which data points are acquired and in what order the data points are acquired, i.e. the trajectory of the data acquisition. Before the assembly of the data of the various coils, the reduced MR data set can be reconstructed so that a reconstructed MR data set is obtained. The reconstruction takes place by the application of a reconstruction kernel to the reduced MR data of each coil. The associated reconstruction kernels of the various coils are designated as a set of reconstruction kernels.

It is possible to associate various reconstruction kernels—that respectively allow the reduced MR data sets to be reconstructed—with an undersampling scheme. From the reconstructed MR image data of the various RF coils it is then possible to calculate a composite MR image in the form of accelerated MR image data.

In CAIPIRINHA and GRAPPA, various possibilities to undersample k-space are known from F. A. Breuer et al., Mag. Res. in Med. 55 (2006), 549. In particular, for a given reduction factor there are multiple possibilities to undersample k-space, i.e. various undersampling schemes. However, it is known that MR images reconstructed from the different undersampling schemes can have different noise. In Breuer et al, a quantification of the signal noise of the image (i.e. of the image noise) takes place using the accelerated and composite image data themselves in the form of a spatially averaged geometry factor (g-factor). However, to select the optimal undersampling scheme this requires first that the complete measurement sequences or computation operations must be implemented for image reconstruction, and then that a quantification of the image noise is implemented using the image data themselves.

SUMMARY OF THE INVENTION

An object of the invention is to provide an improved method and an improved device that enable an undersampling scheme of k-space and an associated set of reconstruction kernels to be selected before the acquisition of reduced MR data.

According to one aspect of the invention, a method to select an undersampling scheme of k-space and an associated set of reconstruction kernels to acquire reduced magnetic resonance (MR) data sets with multiple coils, a calibration data set is acquired for each of the respective coils. Furthermore, the method includes the determination of a noise covariance by measurement of autocorrelations and correlations of the noise of the various coils, the calculation of at least one set of reconstruction kernels for each of the multiple undersampling schemes from the calibration data sets of the various coils, and—for each set of reconstruction kernels—the calculation of a characteristic value from the noise covariance and the respective reconstruction kernels of the coils. The characteristic value is proportional to a mean spatial value of the signal noise of an MR image. Furthermore, the method includes the selection of a selected undersampling scheme and a selected set of reconstruction kernels based on the calculated characteristic values.

The various coils can be receiver coils that can inductively detect a magnetic resonance signal. The magnetization is mapped (detected) as a voltage signal by the coil. The various coils are typically present as a coil array that has a defined spatial arrangement.

According to this aspect of the present invention, it is possible to calculate, from the calibration data set of the various coils and a measured noise covariance a characteristic value that is proportional to a mean spatial value of the signal noise of an MR image (i.e. image noise). Image noise is typically an essential quality criterion of an MR image. If the image noise is high, it is difficult to identify weakly resolved features in the MR image without problems.

A reconstruction kernel is initially described by source and target points. For the various acquired k-space data points, a function is calculated that maps the source points to the target points. This function can be calculated for the calibration data set (for example by matching to the data points) since the calibration data set has typically been acquired with a high k-space resolution, such that both source points and target points have been acquired. Since the calibration data sets have been measured differently for each coil, the calculated reconstruction kernels (for the same source and target points) assume different values for the different coils. The imaging functions of the reconstruction kernels that are adapted to the calibration data sets are also designated as weightings, but in the following the term "reconstruction kernel" is also used for the calculated weightings. The reconstruction kernels for various coils (but with the same source and target points) are designated as a set of reconstruction kernels. For an undersampling scheme there can be multiple reconstruction kernels that enable a reconstruction of the undersampled data. However, a reconstruction kernel is frequently unambiguously associated with an undersampling scheme.

The method accordingly allows those imaging parameters (such as undersampling scheme and reconstruction kernel) for a measurement scheme that lead to a reduced image noise in the ultimately acquired MR image to already be selected before the acquisition of an actual MR image, for example within the scope of an adjustment. In comparison to conventional methods, this allows the various completely acquired MR images to be compared so that from among the image can be selected that has a reduced image noise so as to permit the measurement sequence to be substantially shortened.

In the method according to the invention, for the undersampling scheme and the associated set of reconstruction kernels for which a minimum characteristic value has been calculated to be chosen as a selected undersampling scheme and selected set of reconstruction kernels. Since the characteristic value is proportional to a mean spatial value of an image noise, that set of reconstruction kernels and the associated undersampling kernel that has a minimum characteristic value can be selected. However, it is also possible (for example) to select that undersampling scheme as the undersampling associated with a set of reconstruction kernels that is below a threshold and that enables a simple k-space trajectory. A threshold comparison can generally take place.

Furthermore, the determination of the noise covariance can be implemented by calculating the linear combinations and renormalization of the calibration data sets of the various coils at transformed calibration data sets, such that cross-correlations of the noise covariance between the various coils with regard to the transformed calibration data sets are no longer present (i.e., are zero) and the autocorrelations are identical; and use of the transformed calibration data sets as calibration data sets in the following method.

In general, the signal noise has both correlations and autocorrelations between the various coils. Here a correlation of the signal noise between the various coils means that the signal noise of a first coil is influenced by the signal noise of a second coil. Furthermore, the auto-correlations of the signal noise of the various coils can have different values. This is to be physically interpreted by signal noise of the various coils of different strength. While the signal noise does in fact also influence of the image noise of an MR image, the same signal noise can produce different image noise due to various possible measurement sequences and computation operations.

It is advantageous for a de-correlation of the various noise channels to be implemented, for example before the various computation operations. De-correlation means that the non-diagonal elements are eliminated for a noise covariance that is represented in matrix form. Physically, this means that a linear transformation is identified so that the noise of the various transformed signals is uncorrelated. In practice, such a diagonalization of a noise covariance matrix can take place by a suitable coordinate transformation in the abstract coil domain. Various methods for this are known to those skilled in the art. Moreover, the associated calibration data sets that are initially acquired in association with the various coils are accordingly transformed. Furthermore, by a renormalization of the various transformed calibration data sets, it is possible make the various diagonal entries of the associated transformed noise covariance matrix all the same. In other words: the information of the correlation and autocorrelation of the signal noise is acquired to a certain extent in the (transformed and renormalized) calibration data sets so that a transformed noise covariance matrix is equal or proportional to the identity matrix. The transformed calibration data sets that are obtained in such a manner relate to an abstract coil space that has a transformed coordinate system relative to the original coil space that is defined by the physical arrangement of the coils. It is then possible to implement the remaining method with the transformed calibration data sets and the noise covariance matrix that is proportional to the identity matrix.

In particular, it is possible to remove the dependency of the characteristic value on the position in k-space (which is due to the dependency of the calibration data set on the position in k-space) by averaging over the various k-space positions. As described above, the calibration data sets typically have a dependency on the position in k-space. Therefore, a characteristic value calculated on the basis of the calibration data sets of the various coils can also have a spatial dependency. "Spatial dependency" means a dependency on the position in image space or a dependency on the position in k-space (i.e. in the space of the spatial frequencies). It is possible to transition between the two cited spatial dependencies by Fourier transformation and inverse Fourier transformation. It is then possible to remove the spatial dependency of the characteristic value by an averaging across the various k-space positions. However, an averaging could also take place in the spatial domain across the various corresponding spatial positions.

It is possible for the calculation of the characteristic value for each set of reconstruction kernels to include the presentation of a set of reconstruction kernels as a respective reconstruction kernel matrix calculation of the L2 norm of the respective reconstruction kernel matrix, and averaging the L2 norm across their various locations in k-space. If the respective set of reconstruction kernels is represented as a reconstruction kernel matrix, it is thus particularly simple to calculate an L2 norm of the corresponding matrix. The L2 norm is defined as the root of the sum of the squares of the matrix elements. An averaging of the L2 norm of the reconstruction kernel matrix across the various locations in k-space can subsequently take place. As already explained, due to the dependency on the position in k-space of the calibration data set, a dependency (for example of the L2 norm) also exists on the position in k-space. This dependency can be eliminated by averaging of the L2 norm in k-space.

If the L2 norm is calculated to calculate the characteristic value, the characteristic value can be determined efficiently. In particular, the calculation in such a manner can be implemented particularly quickly so that only a small amount of time is taken for the calculation of the characteristic value.

Furthermore, the noise covariance can be determined independently of the position in k-space. The noise covariance consists of correlations and auto-correlations between the signal noises of the various coils. For example, it is possible to quantify the signal noise in the form of the noise covariance without application of a slice coding gradient or phase coding gradient or a basic magnetic field, i.e. without alignment of the nuclear spins and respectively, without a measurement sub in the sensitive region of the MR system. This corresponds to a determination of the signal noise without k-dependency. For example, the signal noise can be determined by the acquisition of the signal value as a function and subsequent averaging or calculation of the standard deviation over time. In general, it is possible to obtain the noise covariance from a set of different data points.

According to a further aspect of the invention, a method for MR imaging is provided that includes choosing a selected undersampling scheme and a selected set of reconstruction kernels according to the method as described above. Furthermore, the method according to this aspect includes the acquisition of a reduced MR data set with the selected undersampling scheme for each coil, and the application of the respective selected reconstruction kernel to the reduced MR data set for each coil in order to obtain a respective reconstructed MR data set therefor. Furthermore, the method of this aspect includes calculating an MR image based on the reconstructed MR data sets of the individual coils.

If an undersampling scheme and an associated set of reconstruction kernels are initially selected using the method according to this aspect of the present invention, this results in the selected undersampling scheme and the selected set of reconstruction kernels ensuring that the signal noise of an MR image (i.e. the image noise) that was acquired with these parameters is reduced. Since a selection of an undersampling scheme and associated set of reconstruction kernels can take place based only on the acquisition of a noise covariance and calibration data sets for the respective coils, the time expenditure that is necessary to determine the characteristic value is low. The time expenditure in particular is low in comparison to a completely implemented measurement sequence. Therefore, the optimal undersampling scheme can typically be determined in the course of an adjustment before implementation of each measurement sequence. This has the advantage of an increased MR image quality due to reduced image noise and a fast implementation by parallel imaging within the scope of a 3D measurement sequence.

In particular, it is possible for the calibration data set to be acquired with a first data point density in k-space, and the reduced MR data set to be acquired with a second data point density in k-space, with the first data point density being greater than the second data point density. The calibration data set is typically acquired such that all accessible k-space data points are used for data acquisition. This means that the k-space data point density is selected to be particularly high for the calibration data set. The data point density is typically limited by system-dependent parameters. For example, it is not possible to scan k-space with an arbitrarily high resolution.

A further acceleration can be achieved by acquiring the reduced MR data set with a data point density that is lower than the maximum achievable data point density. For example, only every third or fourth k-space line can be sampled for data acquisition. This undersampling of k-space is quantified by an acceleration factor. In the above example, the acceleration factor is four since only every fourth k-space line is sampled. In particular, it is possible to select different undersampling schemes given the same acceleration factors, i.e. given the same reduced data point density.

According to a further aspect of the invention, a magnetic resonance system is provided for the selection of an undersampling scheme of k-space and an associated set of reconstruction kernels for acquisition of reduced magnetic resonance (MR) data sets with multiple coils. The magnetic resonance system has a computer that is configured to receive a calibration data set for each respective coil, and to determine a noise covariance by measurement of autocorrelations and correlations of the noise of the various coils. Furthermore, the MR system has a calibration unit that is configured to calculate at least one set of reconstruction kernels for each of the multiple undersampling schemes from the calibration data sets of the various coils, and to calculate a characteristic value for each set of reconstruction kernels from the noise covariance and the respective reconstruction kernels of the coils, with the characteristic value is proportional to a spatial mean value of a signal noise of an MR image. The calibration unit is set up in order to select a selected undersampling scheme and a selected set of reconstruction kernels based on the calculated characteristic values.

The advantages described above are also achieved by the magnetic resonance system.

BRIEF DESCRIPTION OF THE DRAWINGS

FIG. 1 is a schematic illustration of an MR system.
FIG. 2 illustrates various undersampling schemes.
FIG. 3 is a flowchart of an embodiment of the present invention.

DESCRIPTION OF THE PREFERRED EMBODIMENTS

FIG. 1 schematically shows a magnetic resonance (MR) system 30 according to an embodiment of the present invention. The MR system has a basic field magnet 10 that generates a polarization field or basic magnetic field. An examination subject (here an examined person 11) on a bed table 13 can be moved into the magnet 10. Furthermore, the MR system 30 has a gradient system 14 that generates magnetic field gradients that are used for imaging and spatial coding. A radio-frequency (RF) coil unit 28 is provided to excite the polarization of the magnetization that arises in the basic magnetic field, for which purpose the radio-frequency coil arrangement 28 radiates a radio-frequency field into the examined person 11 in order to deflect the magnetization out of the rest state. The radio-frequency coil arrangement 28 is thus also designated as a transmission coil arrangement or excitation coil arrangement. Amplitude-modulated radio-frequency pulses are typically used to deflect the magnetization out of the rest state. A radio-frequency operating unit 27 that, for instance, can include a radio-frequency generator and an amplitude modulation unit is used to generate such radio-frequency pulses. A gradient operating unit 23 is provided to control the magnetic field gradients.

The acquisition of magnetic resonance signals (MR data) can take place by means of the radio-frequency coil arrangement 28. In particular, in the implementation of an accelerated acquisition method (for example GRAPPA or CAIPRIHINA) the MR system 30 can also have a local receiver coil or coils. FIG. 1 shows two such coils 15a and 15b as examples. These can be part of a larger coil array (for example phased array coils) that includes additional coils (receiver coils). Due to the spatially independent arrangement of the coils (and thus the different sensitivity profiles), additional spatial information is obtained. Essentially, an additional spatial coding can be achieved by a suitable combination of the magnetic resonance data acquired simultaneously by the coils. Furthermore, k-space does not need to be completely sampled, and an acceleration of the acquisition can be achieved by an undersampling and reconstruction using the reconstruction kernel. The receiver coils can respectively have separate receiver units so that a raw data set with MR data can be acquired in parallel by (with) each receiver coil. Only one computer 22 is shown in FIG. 1, but the computer 22 is designed to acquire parallel data from the various coils 15a, 15b.

The computer 22 can furthermore quantify the signal noise. The signal noise is the noise of the raw data sets acquired by the various coils. The signal noise affects the later image noise, i.e. the actually perceived noise of the processed MR data that are present in the form of an MR image.

The quantification of the signal noise takes place by measurement of a noise covariance $\Xi_{mn}$ by the computer 22, for example. For example, the noise covariance can be represented in matrix form:

$$\Xi = \begin{pmatrix} \Xi_{11} & \Xi_{21} \\ \Xi_{12} & \Xi_{22} \end{pmatrix},$$

wherein the diagonal elements $\Xi_{11}$ and $\Xi_{22}$ represent the autocorrelations of the signal noise, and the non-diagonal elements $\Xi_{12}$ and $\Xi_{21}$ represent correlations of the signal noise between the various coils. The above representation of the noise covariance can be generalized for more coils than two.

By the parallel acquisition of MR data by the separate receiver units supplied to the computer 22, the coil noise for each receiver unit (i.e., in each acquired data set) is essentially uncorrelated, meaning that the non-diagonal elements of the noise covariance matrix are small in comparison to the diagonal elements, so that a better signal-to-noise ratio (SNR) can be achieved. Remaining correlations—for example between adjacent coils—can be accounted for by a pre-processing of the acquired MR data in the form of a de-correlation.

The implementation of MR measurement sequences is centrally controlled in the magnetic resonance system 30 by the pulse sequence controller 21. The pulse sequence controller 21 controls the radiation of RF pulses, the application of gradient fields and the acquisition of resulting MR signals. A reconstruction of image data from the raw MR data and a continuing processing of the image data takes place in an image computer 19. Through an operating console 12, an operator can select, for example, a measurement sequence protocol and enter and modify imaging parameters.

A calibration unit 29 is provided in order to determine imaging parameters (which are used for the later implementation of the measurement sequence) within the scope of an adjustment or calibration measurement.

3D measurement sequences are known to those skilled in the art, such that additional details of these methods need not be described in detail herein. Furthermore, the general functioning of an MR system is known to those skilled in the art, such that a more detailed description of the general components is not necessary herein.

Although the various components of the MR system 30 have been presented and discussed and presented as separate units in the exemplary embodiment discussed with regard to FIG. 1, it is also possible for various components to be combined into one unit. For example, individual components can be implemented as hardware or software, or as a combination thereof, and be executed together or separately in one or more modules.

The pulse sequence controller 21 controls the implementation of (for example) a measurement sequence according to a method such as GRAPPA or CAIPIRINHA. A reduced data set is thereby acquired in parallel with each of the coils 15a, 15b. More than two coils can also be used for parallel acquisition of reduced MR data sets. A reduced MR data set $I_k^{red}$ (defined in k-space) is a data set for which k-space has not been completely sampled, i.e. in which k-space lines (for example) have been omitted (the index k designates the respective coil). It should be clear that, in addition to the omission of k-space lines, other accelerated acquisition methods also exist that implement a radial or spiral-shaped sampling, for example, such that k-space in defined regions is sampled with a lower density than in other regions. The k-space data points to be sampled are determined by the field of view to be depicted and the desired resolution of the resulting image data, for example, or also using a calculated image noise. The precise implementation of the sampling of k-space is designated as an undersampling scheme. For example, an undersampling scheme is characterized by the arrangement of the measured data points in k-space and the number of omitted k-space data points. For example, if every third k-space line is measured, this is characterized by what is known as an acceleration factor that assumes a value of three.

Since the acquisition of the reduced MR data sets takes place in parallel, the undersampling scheme is normally the same for every data set that was acquired with different coils, meaning that each data set has the same gaps or, respectively, omissions or missing MR data points. For every coil $k=1 \ldots N_c$ it is possible to complete the respective reduced MR data set $I_k^{red}$ by means of a reconstruction kernel $w_{ki}$ in that the reconstruction kernel $w_{ki}$ is applied to $I_k^{red}$ in order to reconstruct missing MR data. Reconstructed MR data sets $I_k^{acc}$ arise for the various coils:

$$I_k^{acc} = \sum_{i=1}^{N_c} w_{kl} \cdot I_l^{red}.$$

For example, the reconstruction kernel $w_{ki}$ can thereby be represented in matrix form, the elements of which are what are known as the weightings. Weightings can be calculated using calibration data sets that have a sufficiently high data point density. The weightings can be calculated by adaptation of a function linking defined source and target points. This can take place by (for example) a central k-space region being completely sampled within the scope of the calibration data set. This means that the calibration data set has a data point density that is typically higher than the data point density of the reduced MR data set. The elements of the reconstruction kernel are then adapted such that the k-space region of the calibration data set is correctly reconstructed by the reconstruction kernel. This calculation of the respective reconstruction kernel generally delivers different weightings for the various coils. A set of reconstruction kernels hereby designates the set of the reconstruction kernels calculated for various coils that have the same source and target points.

The image computer 19 and the calibration unit 29 are designed in order to implement this determination of the reconstruction kernel $w_{ki}$ from the calibration data set, its application to the reduced MR data sets, and the transformation between k-space and image space. Lastly, the calculation of a combined, accelerated data set $I^{acc}$ takes place from the reconstructed MR data sets $I_k^{acc}$ of the various coils 15a, 15b, which data set $I^{acc}$ can be used as an MR image after a transformation into image space.

As already explained, various possibilities exist to undersample k-space exist for a defined acceleration factor. This means that there are various possible undersampling schemes. A schematic representation of different undersampling schemes is shown in FIG. 2. A full sampling of k-space is hereby shown in the uppermost line. The horizontal or vertical directions are different spatial coding directions in k-space, for example a phase coding direction and a frequency coding direction. Every possible data point in k-space is thereby measured (filled), which is indicated by a black square. In total, 4×4 data points are measured, meaning that 16 data points are acquired in total. For example, the density of the acquired data points can be provided by the precision of the slice selection or, respectively, phase coding of the MR system. Such parameters are typically determined by the gradient unit or the radio-frequency unit.

Further possible undersampling schemes for an acceleration factor of four are shown in FIG. 2. An acceleration factor of four hereby means that only every fourth data point (of 16 data points) is measured. This means that four measured data points are distributed across the possible 16 positions in k-space. In general, the number of possible undersampling schemes increases with increasing acceleration factor. Possibilities to define undersampling schemes for given acceleration factors or different k-space trajectories are known to those skilled in the art and need not be explained in detail herein.

The different undersampling schemes allow a calculation of accelerated data sets $I_k^{acc}$ or, respectively, of an MR image (i.e. $I^{acc}$). The MR images that are acquired for different undersampling schemes generally have different image noise. The image noise that is associated with a defined undersampling scheme can be determined afterward, for example, using the acquired MR image data $I^{acc}$. However, with regard to FIG. 3 a method according to the invention is explained that enables the image noise for the different undersampling schemes to be quantified before the acquisition of the reduced MR data sets $I_k^{red}$, i.e. before the complete execution of an undersampling scheme within the scope of a measurement sequence. It is then possible to already select an optimal undersampling scheme before the time-intensive implementation of the actual measurement sequence.

Such a method is described with regard to FIG. 3. The method begins in Step 300. In Step 301a noise covariance $\Xi_{mn}$ is initially determined. This has already been explained with regard to FIG. 1. A calibration data set for each of the receiver coils is subsequently acquired in Step 302. In the literature calibration data sets are designated as auto-calibration data sets (ACS), for example. The calibration data set typically has a k-space data point density that corresponds to the maximum possible k-space data point density, meaning that every available k-space data point in a defined region is sampled (filled with a data entry). The calibration data sets are typically acquired in a region near the k-space center, i.e. for small or disappearing values of the k-vector. In particular, the noise covariance determined in Step 301 typically has no dependency on the position in k-space.

For example, it is possible to implement both measurement steps 301 and 302 respectively before the implementation of an MR measurement sequence to acquire actual MR image data. Such an adjustment measurement can be implemented so that it can have a duration of approximately two to five seconds, for example. The subsequent computation steps 303-309 are implemented using the variables measured in Steps 301 and 302.

A first implemented computation operation in step 303 concerns the implementation of a de-correlation of the various coil channels. Namely, the noise covariance typically has correlations of the signal noise between the various coils. This means that a noise covariance matrix includes non-diagonal elements. Moreover, it is possible that the autocorrelations of the signal noise—i.e. the diagonal elements of a noise covariance matrix—have different values in alternation. Physically, this means that the signal noise has different magnitude in the various receiver coils.

Within the scope of the de-correlation that is implemented in Step 303, however, it is possible to obtain a noise covariance matrix by corresponding renormalization and transformation (i.e. formation of linear combinations of the various calibration data sets that were acquired the various coils in Step 302) with regard to these renormalized calibration data sets, which noise covariance matrix is diagonal and proportional to the identity matrix. This is explained in detail in the following:

The noise covariance matrix that was measured in Step 301 is presented in matrix form. A diagonal matrix is generated by means of suitable calculation operations, what is known as "diagonalization". The diagonal elements correspond to the matrix eigenvalues. In other words: a transformation of the coordinate system is conducted in the abstract coil domain such that the various coils have no correlations of the signal noise in the transformed coordinate system. Calibration data sets transformed by corresponding formation of linear combinations of the various calibration data sets are then obtained. The implementation of the linear combinations is based on the diagonalization of the noise covariance matrix. After this step of the linear combination of the various calibration data sets, the transformed noise covariance matrix typically still has different diagonal elements. This means that the auto-correlations of the signal noise have different values in the transformed coordinate system of the abstract coil space. In order to remedy the different values of the auto-correlations of the signal noise, a renormalization of the different transformed calibration data sets is implemented.

Formulated abstractly, a portion of the information about the signal noise that is measured in Step 301 is adopted into the respective transformed calibration data sets so that said transformed calibration data sets have a noise covariance matrix that has no non-diagonal elements (correlations of the signal noise) and is proportional to the identity matrix (identical auto-correlations of the signal noise).

After such a de-correlation of the signal noise of the various coils has been made, the further method can be continued based on the transformed calibration data sets. The corresponding associated noise covariance matrix is then an identity matrix. In the following the term "transformed calibration data sets" is not used, rather only the "calibration data sets". Moreover, it is also possible to implement the following methods without a preceding de-correlation as described in connection with Step 303. However, a preceding de-correlation simplifies the various calculations in the following steps.

An undersampling scheme is initially selected in Step 304. The undersampling scheme can be selected from, for example, a database of different possible undersampling schemes. The selection can take place upon stipulation of a predetermined acceleration factor, for example. However, it is also possible for the different possible sampling schemes to be calculated according to a suitable method.

The selection of a suitable reconstruction kernel then takes place in Step 305. A reconstruction of the MR data can typically take place using different possible reconstruction kernels for each undersampling scheme that was selected in Step 304. A reconstruction kernel typically embodies the definition of different points that are known as source and target points. Using the calibration data set acquired with high resolution in k-space in Step 302, it is possible to adapt the various elements of the reconstruction kernel (what are known as weightings) for each coil such that—given specification of the data values of the source points—the data values of the target points are calculated correctly. Both the source points and target points are hereby known in the range of the calibration data set, such that the weightings can be adapted accordingly. In the following the term "reconstruction kernel" also designates the linking function between source and target data points (i.e. the weightings) that was already calculated using the calibration data set. Given identical source points or identified target points, the adaptation for various coils generally delivers different weightings. The reconstruction kernels with the same source and target points (but possibly different weightings) are designated as a set of reconstruction kernels.

In Step 306, the calculation of the reconstruction kernel is implemented as just described for each of the coils using the respective calibration data sets, such that a set of reconstruction kernels is obtained.

However, with regard to Step 307 it is also possible to represent the respective reconstruction kernels in positional space. A local noise covariance matrix $\Xi^{local}(x)$ at the point x can then be represented in positional space as $$\Xi^{local}_{ij}(x)=\Sigma_{m,n}W_{im}(x)\Xi_{mn}W_{jn}(x)^*,$$

wherein $\Xi$ represents the noise covariance, W(x) Fourier-transforms the reconstruction kernel $w(k_n)$ into positional space, and indices refer to the coils. These and the following calculations are implemented in Step 307 to calculate the spatially averaged variance. w and W hereby designate the reconstruction kernel selected and reconstructed in Step 305 for an undersampling scheme.

Given a corresponding image reconstruction that is known to the man skilled in the art by the term "sum-of-squares", the following expression results from this for the local variance of the noise in the reconstructed image (i.e. image noise):

$$\sigma^2(x)=\Sigma_{m,n,i}W_{im}(x)\Xi_{mn}W_{in}(x)^*=Tr(W(x)\Xi W^+(x)).$$

A formatting of the formula in matrix notation takes place in the second step. Tr designates the calculation of the trace of the matrix.

A practical implementation of the method can resort to matrix calculation operations, for example, or can even be implemented according to the presented addition rules. The effects of the underlying calculation operations correspond to one another.

Furthermore, a spatial averaging is implemented. The spatial averaging can be implemented in k-space. Spatial averaging then means an averaging across all k-space data points of the reconstruction kernel. For example, a spatial averaging can take place by summation of the various k-space points. A subsequent normalization (for example to the number of points added up) is possible but not necessary.

The spatially averaged variance $<\sigma^2(x)>$ that is proportional to the image noise results as:

$$\sigma^2(x)>=\Sigma_n Tr(w(k_n)\Xi w^+(k_n)),$$

wherein $w(k_n)$ is the reconstruction kernel in k-space.

In the case of a de-correlation of the channels as it has been described with regard to Step 303, this simplifies to the L2 norm of the reconstruction kernel. This is the case since then $\Xi$ is the identity matrix, or is proportional to it. It follows that:

$$\sigma^2(x)>=\Sigma_n(\|w(k_n)\|_2)^2$$

In the following the selection of $<\sigma^2(x)>$ is checked for plausibility or, respectively, motivated as a measure of the image noise. A strong analogy exists to the spatially averaged geometry (g) factor as a measure of the noise amplification by parallel imaging. For statistical reasons, if the spatially averaged g-factor is defined as $$g^{average}=\|g(X)\|_2/V,$$

wherein $$\|g(x)\|_2=\sqrt{\int dx \cdot g(x)^2},$$

i.e. as an L2 norm divided by the volume, $$g^{average}=<\sigma^2(x)>^{1/2}/Tr(\Xi)$$

is found.

It is also possible to average the g-factor arithmetically, for example. The last equation can also be viewed as a definition. The numerator $<\sigma^2(x)>^{1/2}$ is the averaged image noise but is also added up over the contributions of all coils. The numerator $Tr(\Xi)$ is the sum of the variance in all channels.

The parallels with the averaged variance are obtained according to the above formulas. Histograms for the spatial distribution of the g-factor are shown in F. A. Breuer et al., Mag. Res. in Med. 55 (2006) 549. The histograms are created from actually acquired MR image data. Such histograms suggest that the spatial averaging according to the invention is a suitable measure of the quantification of the image noise. In particular, in contrast to Breuer et al. the characteristic value for the image noise can be determined without complete reconstruction of the image.

The equation for the spatially averaged variance that is proportional to the image noise in positional space represents a characteristic value for the reconstruction kernel selected in Step 306 or for the undersampling scheme selected in Step 304. This characteristic variable can initially be stored, for example. A check as to whether an additional reconstruction kernel is presented with regard to the undersampling scheme selected in Step 304 then takes place in Step 308. If this is the case, this additionally present reconstruction kernel is selected in Step 305 and calculated in Step 30, and in Step 307 the spatially averaged variance for this reconstruction kernel is recalculated and the associated characteristic value is stored. These steps 305, 306, 307 are implemented until—as is determined in Step 308—an additional reconstruction kernel is present for the undersampling scheme determined in Step 304.

If it is determined in Step 308 that no additional reconstruction kernel is present for the selected undersampling scheme, in Step 309 a check is made as to whether an additional undersampling scheme is present (for example for a defined acceleration factor). If it is established in Step 309 that an additional undersampling scheme is present, in Step 304 this undersampling scheme is selected and the characteristic value is respectively determined for the various associated reconstruction kernels in Steps 305, 306, 307. As soon as the characteristic values have been determined for all undersampling scheme or, respectively, all associated reconstruction kernels (wherein each of the characteristic values is proportional to the spatially averaged variance), the selection of the selected undersampling scheme and of the associated selected set of reconstruction kernels that has a minimum characteristic value (i.e. a minimum spatially averaged variance) takes place in Step 310.

The actual measurement of the MR data can then be implemented in Step 311, based on the reconstruction kernel or, respectively, undersampling scheme that is selected in Step 310. This measurement initially typically exists in the undersampling of k-space with the selected undersampling scheme. Reduced MR data sets are then acquired for each of the coils. For each coil, the respective reconstruction kernel from the set of reconstruction kernels is subsequently applied to the reduced MR data set, such that a reconstructed MR data set is obtained. In contrast to the respective reduced MR data set, the reconstructed MR data set has a higher data point density in k-space. This is the case since the data points omitted by the undersampling scheme have been reconstructed by application of the reconstruction kernel. The various reconstructed MR data sets of the respective coils are then composed into an accelerated MR data set or, respectively, an MR image. Various methods for this are known to the man skilled in the art. In particular, the MR image acquired in Step 311 on the basis of the selected undersampling scheme or, respectively, selected set of reconstruction kernels has a reduced noise (i.e. image noise). This is the case since the undersampling scheme or, respectively, the set of reconstruction kernels that have a characteristic value which indicates a minimum image noise was selected in Step 310. The obtained MR image can therefore be optimally used for diagnosis. The method comes to an end in Step 312.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to select an undersampling scheme for entering data into k-space, and to select an associated set of reconstruction kernels to acquire reduced magnetic resonance data sets with multiple acquisition coils, comprising:
    operating a magnetic resonance data acquisition unit, comprising a plurality of magnetic resonance data acquisition coils, to acquire a calibration data set for each of said plurality of coils, each calibration data set embodying noise therein;
    in a processor, determining, from the noise in the respective calibration data sets, a noise covariance by measuring autocorrelations and correlations of the respective noise of the respective coils respectively represented in the calibration data sets;
    in said processor, calculating at least one set of reconstruction kernels for each of a plurality of undersampling schemes from said calibration data sets of the respective coils;
    in said processor, for each of said reconstruction kernels, calculating a characteristic value from the noise covariance and the respective reconstruction kernels of the coils, said characteristic value being proportional to a spatial mean value of signal noise of an MR image to be reconstructed using the respective reconstruction kernels; and
    in said processor, choosing a selected undersampling scheme and a selected set of associated reconstruction kernels from the calculated characteristic values, and displaying an electronic representation of the selected undersampling scheme and the selected set of reconstruction kernels available at a display in communication with said processor.

2. A method as claimed in claim 1 comprising selecting, as said selected undersampling scheme and said associated set of reconstruction kernels, an undersampling scheme among said plurality of undersampling schemes that has a minimum characteristic value.

3. A method as claimed in claim 1 comprising determining said noise covariance by:
    calculating linear combinations and normalizing the respective calibration data sets of the respective coils into transformed calibration data set, wherein correlation of the noise covariance between the respective coils are no long present, and the autocorrelations are identical; and
    using the transformed calibration data sets as said calibration data sets for selecting said reconstruction kernels.

4. A method as claimed in claim 3 comprising, in said processor, removing a dependency of the characteristic value on respective positions in k-space by averaging across a plurality of k-space positions.

5. A method as claimed in claim 1 comprising calculating the characteristic value for each set of reconstruction kernels by:
    providing a set reconstruction kernels formatted as a reconstruction kernel matrix;
    calculating an L2 norm of the respective reconstruction kernel matrices; and
    averaging said L2 norm over respective locations in k-space for each reconstruction kernel matrix.

6. A method as claimed in claim 1 comprising determining the noise covariance independently of a position in k-space.

7. A method for acquiring magnetic resonance image data, comprising:
    operating a magnetic resonance data acquisition unit, comprising a plurality of magnetic resonance data acquisition coils, to acquire a calibration data set for each of said plurality of coils, each calibration data set embodying noise therein;
    in a processor, determining, from the noise in the respective calibration data sets, a noise covariance by measuring autocorrelations and correlations of the respective noise of the respective coils respectively represented in the calibration data sets;
    in said processor, calculating at least one set of reconstruction kernels for each of a plurality of undersampling schemes from said calibration data sets of the respective coils;

in said processor, for each of said reconstruction kernels, calculating a characteristic value from the noise covariance and the respective reconstruction kernels of the coils, said characteristic value being proportional to a spatial mean value of signal noise of an MR image to be reconstructed using the respective reconstruction kernels;

in said processor, choosing a selected undersampling scheme and a selected set of associated reconstruction kernels from the calculated characteristic values, and making an electronic representation of the selected undersampling scheme and the selected set of reconstruction kernels available at an output of said processor;

operating the magnetic resonance data acquisition unit to acquire, for each coil, a reduced magnetic resonance data set with the selected undersampling scheme;

in said processor, for each coil, applying the respective reconstruction kernel to the reduced magnetic resonance data set acquired thereby, in order to obtain a reconstructed magnetic resonance data set;

in said processor, calculating a magnetic resonance image from the reconstructed magnetic resonance data sets of the respective coils; and displaying the magnetic resonance image at a display in communication with said processor.

8. A method as claimed in claim 7 comprising the calibration data set with a first data point density in k-space, and acquiring the reduced magnetic resonance data set with a second data point density in k-space, said first data point density being higher than said second data point density.

9. A magnetic resonance system comprising:

a magnetic resonance data acquisition unit comprising a plurality of magnetic resonance data acquisition coils;

a control unit configured to operate said magnetic resonance data acquisition unit to acquire a calibration data set for each of said plurality of coils, each calibration data set embodying noise therein;

a processor configured to determine, from the noise in the respective calibration data sets, a noise covariance by measuring autocorrelations and correlations of the respective noise of the respective coils respectively represented in the calibration data sets;

said processor being configured to calculate at least one set of reconstruction kernels for each of a plurality of undersampling schemes from said calibration data sets of the respective coils;

said processor being configured to calculate, for each of said reconstruction kernels, a characteristic value from the noise covariance and the respective reconstruction kernels of the coils, said characteristic value being proportional to a spatial mean value of signal noise of an MR image to be reconstructed using the respective reconstruction kernels; and said processor being configured to choose a selected undersampling scheme and a selected set of associated reconstruction kernels from the calculated characteristic values, and to make an electronic representation of the selected undersampling scheme and the selected set of reconstruction kernels available at an output of said processor.

\* \* \* \* \*